United States Patent [19]

Houston

[11] 4,315,591
[45] Feb. 16, 1982

[54] METHOD FOR THERMO-COMPRESSION DIFFUSION BONDING A STRUCTURED COPPER STRAIN BUFFER TO EACH SIDE OF A SUBSTRATELESS SEMICONDUCTOR DEVICE WAFER

[75] Inventor: Douglas E. Houston, Ballston Lake, N.Y.

[73] Assignee: General Electric Company, Schenectady, N.Y.

[21] Appl. No.: 210,993

[22] Filed: Nov. 28, 1980

Related U.S. Application Data

[62] Division of Ser. No. 18,653, Mar. 8, 1979, abandoned.

[51] Int. Cl.³ .................... B23K 20/14; H01L 21/58
[52] U.S. Cl. ............................... 228/188; 29/590; 228/193; 357/81
[58] Field of Search ............... 228/188, 193, 243; 357/65, 81; 29/580, 588, 589, 590

[56] References Cited

U.S. PATENT DOCUMENTS

| | | | |
|---|---|---|---|
| 3,295,089 | 12/1966 | Moore | 357/71 X |
| 3,657,611 | 4/1972 | Yoneda | 357/81 |
| 4,067,104 | 1/1978 | Tracy | 228/188 X |
| 4,204,628 | 5/1980 | Houston et al. | 228/193 X |
| 4,257,156 | 3/1981 | Houston | 228/188 X |

FOREIGN PATENT DOCUMENTS 1275377  5/1972  United Kingdom ............... 228/193
WO7901012 11/1979  World Intel. Prop. Org. .

Primary Examiner—Gil Weidenfeld
Assistant Examiner—K. J. Ramsey
Attorney, Agent, or Firm—Marvin Snyder; James C. Davis, Jr.

[57] ABSTRACT

A method is provided for thermo-compression diffusion bonding respective structured copper strain buffers directly to each of the two major opposed surfaces of a substrateless semiconductor device wafer having a beveled outer edge surface. A selected portion of each strain buffer axially aligned with a like portion of the other strain buffer is diffusion bonded to the wafer while subjecting the wafer only to substantially compressive force so as to avoid wafer fracture. The lateral extent of each strain buffer is less than that of the respective wafer surface in contact therewith, allowing the beveled surface to be cleaned and passivated prior to attachment of the strain buffers to the wafer via diffusion bonding.

12 Claims, 3 Drawing Figures

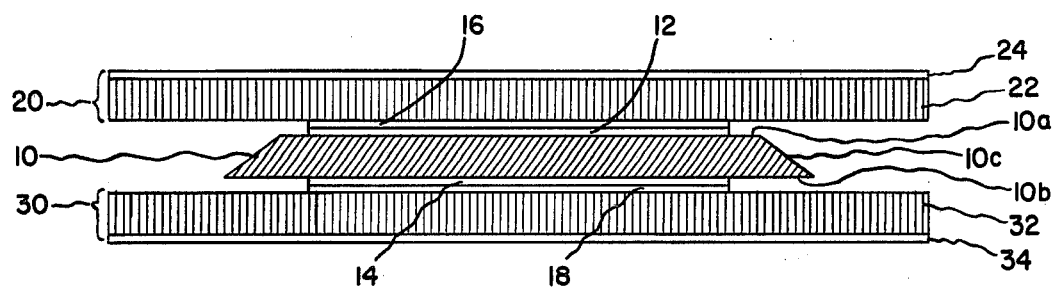
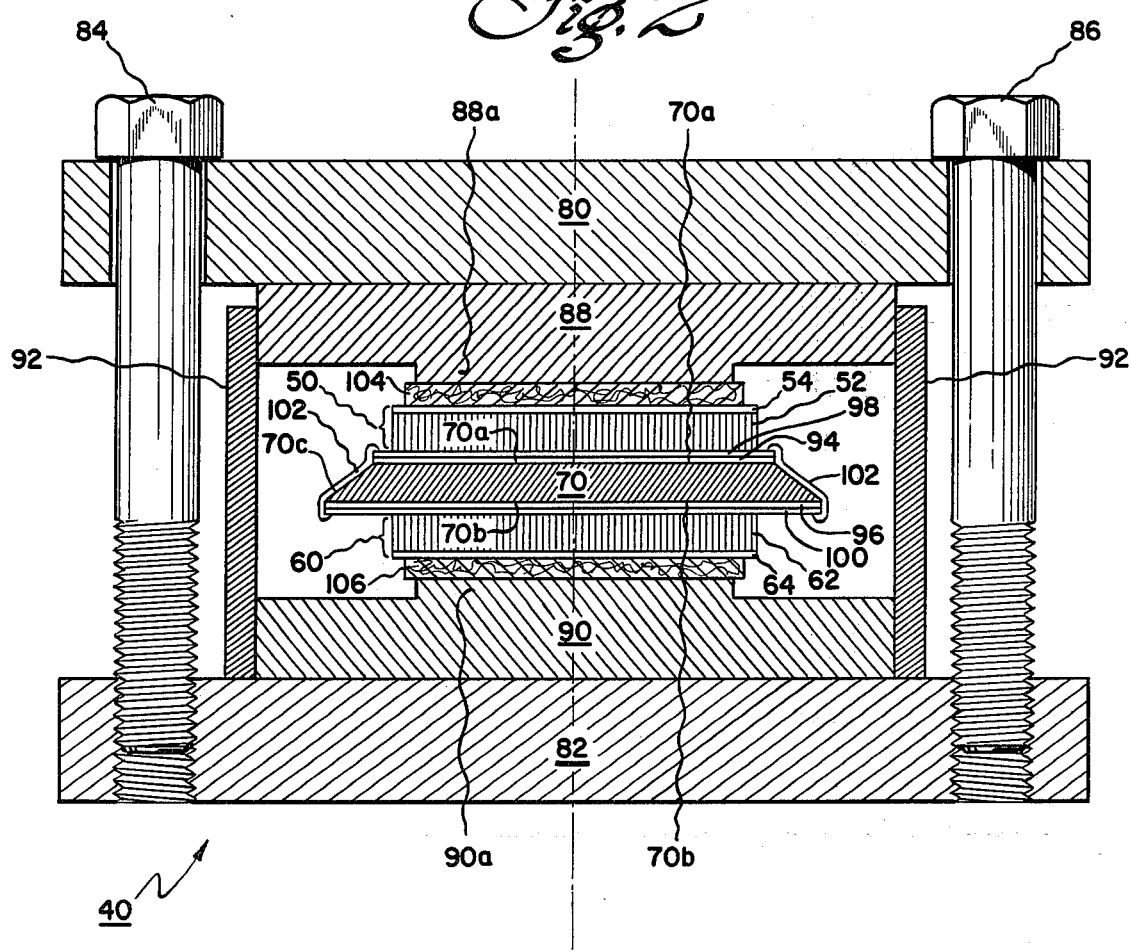

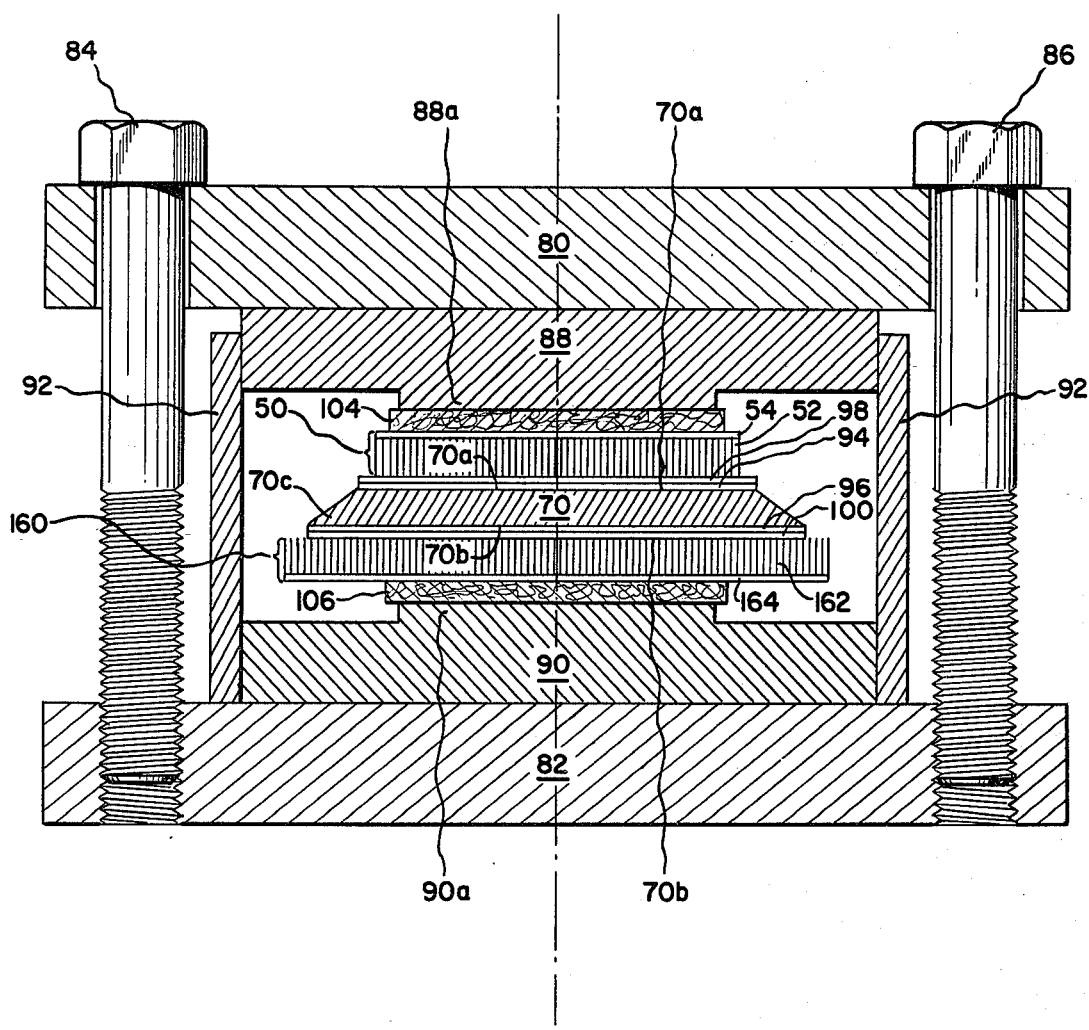

METHOD FOR THERMO-COMPRESSION DIFFUSION BONDING A STRUCTURED COPPER STRAIN BUFFER TO EACH SIDE OF A SUBSTRATELESS SEMICONDUCTOR DEVICE WAFER

This application is a division, of application Ser. No. 018,653, filed Mar. 8, 1979, now abandoned.

BACKGROUND OF THE INVENTION

This invention relates to methods for diffusion bonding surfaces together and, more particularly, to a method for thermo-compression diffusion bonding a respective structured copper strain buffer directly to each of the two major opposed surfaces of a substrateless semiconductor device wafer in a manner to facilitate cleaning and passivating the beveled surface prior to diffusion bonding.

DESCRIPTION OF THE PRIOR ART

When attaching heat sinks to the respective opposed surfaces of a semiconductor device wafer, it is often desirable that these attachments occur as close to the semiconductor device wafer as possible in order to optimize heat removal from the wafer. Such is the case when heat sinks are attached via respective structured copper strain buffers to a semiconductor device wafer. Briefly, a structured copper strain buffer comprises a bundle of substantially parallel, closely packed strands of copper of substantially equal length, one common end thereof being thermo-compression diffusion bonded to a metallic sheet.

One type of prior high power semiconductor device includes a metallic support plate or substrate, typically comprised of tungsten or molybdenum, attached to one of the opposed surfaces of a semiconductor device wafer to provide the inherently fragile wafer with structural integrity. In those devices, heat sinks have been attached via structured copper strain buffers to one or both sides of the wafer support plate structures. A bonding press capable of producing such thermo-compression diffusion bonded devices is described and claimed in Douglas Houston U.S. patent application Ser. No. 927,344, filed July 24, 1978, now abandoned in favor of divisional application Ser. No. 139,177, filed Apr. 11, 1980, now U.S. Pat. No. 4,252,263, and assigned to the instant assignee.

A method for thermo-compression diffusion bonding a structured copper strain buffer to a semiconductor device wafer supported by a tungsten or molybdenum support plate is described and claimed in Glascock et al., U.S. Pat. application Ser. No. 958,100, filed Nov. 6, 1978 and assigned to the instant assignee. It is desirable, however, to diffusion bond respective heat sinks via structured copper strain buffers "directly" to each of the opposed surfaces of a semiconductor device wafer, thereby eliminating the rather expensive metallic support plate and simultaneously providing heat sinks attached to the strain buffers with a more intimate thermal connection to the semiconductor device wafer. More efficient heat conduction away from the wafer results. The term "directly" as used herein signifies that actually such bonds are made to the metallized layers situated on the respective major opposed surface of the wafer, and not to the wafer itself. Several high power semiconductor devices with heat sinks attached via structured copper strain buffers "directly" to a silicon device wafer employing no support plate are described and claimed in the aforementioned Glascock et al. patent application. That is, the structured copper strain buffers are thermo-compression diffusion bonded directly to one or both sides of the semiconductor device wafer.

One method for thermo-compression diffusion bonding structured copper strain buffers "directly" to each side of a semiconductor device wafer unsupported by a support plate is fully described and claimed in my copending patent application, Ser. No. 019,294 filed Mar. 9, 1979 and now U.S. Pat. No. 4,257,156, assigned to the instant assignee. Practice of this method permits fabrication of a beveled semiconductor device wafer with respective structured copper strain buffers diffusion bonded directly to each of the opposed surfaces of the wafer and overhanging the beveled surface. Since the beveled surface is inaccesible for purposes of cleaning and passivation immediately after bonding, the portion of the structured copper strain buffer overhanging the beveled surface can be cut away with a laser beam allowing the exposed beveled surface to be passivated.

In practicing the method of my aforementioned application Ser. No. 019,294, it would be desirable to clean and passivate any beveled surface thus formed, prior to thermo-compression diffusion bonding; however, if such is attempted with the prior press and methods of bonding cited above, the passivant applied to the beveled surface would likely flow on to part of one or both of the major surfaces of the semiconductor device wafer. Hence, when the structured copper strain buffers are squeezed against the respective wafer surfaces during the course of thermo-compression diffusion bonding, the pressures generated in the regions adjacent to where the passivant flows on the major surfaces would not be purely compressive. That is, bowing or tensile forces would be generated in these regions. Because silicon will withstand substantially only compressive forces, these noncompressive forces would likely result in semiconductor device wafer fracture. The bonding press apparatus and bonding method of the present invention avoid this problem by allowing cleaning and passivating of the beveled surface prior to thermo-compression diffusion bonding of the buffers to the wafer.

It will be apparent to those skilled in the art that improved electrical and thermal performance is to be gained by eliminating the tungsten or molybdenum support plate from the semiconductor device wafer. Direct diffusion bonding of heat sinks to both sides of a semiconductor device wafer via structured copper strain buffers achieves this result. Advantageously, a chemical etching step is included in the invention to clean the beveled surface prior to thermo-compression diffusion bonding the strain buffers to the wafer. Prior methods did not accommodate such step prior to diffusion bonding and, once diffusion bonding of the strain buffers has occurred, the inexpensive chemical etch may not be used to clean the beveled surface because it would chemically attack the structured copper strain buffers.

My copending patent application Ser. No. 019,224 filed Mar. 9, 1979 and assigned to the instant assignee, now abandoned, describes and claims a method for thermo-compression diffusion bonding a structured copper strain buffer "directly" to one of the opposed surfaces of a substrateless semiconductor device wafer.

One object of the present invention is to provide an improved bonding press apparatus and method for thermo-compression diffusion bonding respective structured copper strain buffers "directly" to each of the opposed surfaces of a semiconductor device wafer without using an intermediate support plate to strengthen the wafer.

A further object of the invention is to provide a method for more efficiently removing heat from a semiconductor device wafer.

Another object of the invention is to provide a method for thermo-compression diffusion bonding separate structured copper strain buffer to each side of a semiconductor device wafer having a beveled outer edge surface wherein the beveled surface is preliminarily cleaned and passivated without resulting in wafer fracture during subsequent thermo-compression diffusion bonding.

BRIEF SUMMARY OF THE INVENTION

The present invention is directed to increasing the conduction of heat away from a semiconductor device wafer having respective structured copper strain buffers diffusion bonded to each of the two major surfaces thereof. The support plate attached to the semiconductor device wafer as needed in many conventional semiconductor device structures is not required and respective structured copper strain buffers are thermo-compression diffusion bonded "directly" to each of the two major surfaces of the wafer.

In accordance with one preferred embodiment of the invention, an improved press for diffusion bonding metal surfaces of an assembly together includes first and second metallic plate means, each having a predetermined thermal coefficient of expansion. The second plate means are oriented parallel to the first plate means and spaced apart therefrom so as to allow acceptance of the assembly between the first and second plate means. A metallic support connects the first plate means to the second plate means. The support is selected to exhibit thermal expansion smaller than the total thermal expansion in thickness of the first and second plate means when the press is heated to an elevated temperature. The first and second metallic plate means each include first and second raised portions extending therefrom, respectively, and facing each other. Each raised portion includes a flat surface having an identical geometric pattern, respectively, the patterns being in axial and rotational alignment with each other such that equal and opposite pressures are extended on the to-be-bonded metallic surfaces of the assembly situated between the first and second raised portions thereby squeezing the metallic surfaces together at high pressure when the press is heated to an elevated temperature.

In accordance with another preferred embodiment of the invention, a method is provided for thermo-compression diffusion bonding first and second structured copper strain buffers to a substrateless semiconductor device wafer having first and second opposed surfaces of unequal lateral extents and a beveled outer edge surface. A "substrateless" semiconductor device wafer is hereby defined as a semiconductor device wafer unsupported by a support plate, that is, the wafer itself. The first and second structured copper strain buffers each include a bundle of substantially parallel, closely packed strands of copper of substantially equal length having one common end thereof thermo-compression diffusion bonded to a separate metallic sheet, respectively. The first and second major opposed surfaces of the wafer are smoothened, and first and second metallic layers are then applied respectively thereon. First and second metallizations are applied atop the first and second metallic layers, respectively. The beveled surface is cleaned to remove contaminants therefrom and then coated with a passivation material. The semiconductor device wafer with the above-described metallic layers and metallizations disposed thereon is sandwiched between the first and second structured copper strain buffers. Each of these strain buffers is of lateral extent equal to or less than the lateral extent of the respective semiconductor device wafer surface in contact therewith such that the beveled edge surface remains uncovered by either of the structured copper strain buffers. Each structured copper strain buffer is positioned such that the common end of the copper strands opposite the metallic sheet thereof faces the semiconductor device wafer. The so-positioned semiconductor device wafer structure and structured copper strain buffers are surrounded by an inert atmosphere. A loading force is applied to identical, axially aligned portions of the first and second strain buffers, respectively, to squeeze them together at high pressure and, at the same time, the so-positioned semiconductor device wafer and structured copper strain buffers are heated at a temperature within the range of 300° C. to 400° C. Thermo-compression diffusion bonds are thus formed between the two major, opposed, metal-coated surfaces of a substrateless, beveled semiconductor device wafer and respective first and second structured copper strain buffers, without wafer fracture.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 1 is a cross-sectional view of a beveled semiconductor device wafer with structured copper strain buffers having a lateral extent greater than the lateral extent of the wafer thermo-compression diffusion bonded to each of the metal-coated, opposed surfaces of the wafer.

FIG. 2 is a cross-sectional side view of an improved thermo-compression diffusion bonding press showing materials to be bonded together situated therein.

FIG. 3 is a cross-sectional side view of the thermo-compression diffusion bonding press of FIG. 2 showing materials of alternative configuration situated therein to be bonded together.

DETAILED DESCRIPTION OF THE PREFERRED EMBODIMENT

One method for thermo-compression diffusion bonding first and second structured copper strain buffers to the first and second opposed surfaces of a substrateless semiconductor device wafer, respectively, in a manner to prevent bowing forces which causes wafer fracture, is described and claimed in my aforementioned copending patent application Ser. No. 019,294 the disclosure thereof being incorporated herein by reference. Thermo-compression diffusion bonding by that method results in the intermediate structure shown in FIG. 1 wherein a semiconductor device wafer 10 includes opposed major surfaces 10a and 10b and beveled edge surface 10c. First and second metallic layers 12 and 14 are coated respectively on surfaces 10a and 10b. Metallizations 16 and 18 are coated, respectively, on metallic layers 12 and 14. Structured copper strain buffers 20 and 30 are thermo-compression diffusion bonded respectively to metallizations 16 and 18. Structured copper strain buffer 20 includes a bundle of substantially parallel closely packed strands of copper 22, one common end thereof thermocompression diffusion bonded into a metallic sheet 24. Structured copper strain buffer 30 is substantially similar to strain buffer 20 and includes copper strands 32 and metallic sheet 34. As pointed out in the aforementioned Houston et al. patent application, Ser. No. 019,294 structured copper strain buffers 20 and 30 are formed in such a manner as to have a lateral extent greater than that of silicon wafer 10, so as to prevent the silicon wafer 10 from being subjected to bowing forces which cause wafer fracture. Bowing forces are thus substantially eliminated; however, this bonding method essentially prohibits cleaning and passivating beveled surface 10c prior to bonding because of the high probability that passivant applied to surface 10c would flow onto portions of surfaces 10a and 10b, causing wafer 10 to experience bowing forces and nonuniform pressure when thermo-compression diffusion bonding is attempted. To allow passivation of the beveled edge 10c, therefore, a laser beam is used to cut away the portion of structured copper strain buffer 20 overhanging beveled surface 10c. Beveled surface 10c is thereby exposed for cleaning, preferably via sputter etching, and passivating. Conventional economical chemical etching is not a preferable method for cleaning beveled surface 10c because the etchant would chemically attack the structured copper strain buffers 20 and 30.

The present invention constitutes an alternative solution to the problem of preventing bowing forces when thermo-compression diffusion bonding structured copper strain buffers to be a substrateless semiconductor device wafer. One embodiment of the invention desirably allows cleaning of the beveled surface via conventional chemical etching and passivation prior to diffusion bonding.

As illustrated in FIG. 2, an improved press apparatus 40 is provided to bond first and second structured copper strain buffers 50 and 60, respectively, to the opposed major surfaces 70a and 70b of substrateless semiconductor device wafer 70. The outer edge 70c of semiconductor device wafer 70 is beveled as shown in FIG. 2.

Bonding press 40 includes an upper metallic plate 80 oriented parallel to a lower metallic plate 82 with a space provided therebetween. Metallic bolts 84 and 86 pass through respective holes in upper plate 80 and lower plate 82 and are threaded into lower plate 82 to connect the two plates together as illustrated in FIG. 2. A metallic pressing block (or expansion block) 88 is positioned at the center of the lower surface of upper plate 80 and attached thereto. A similar metallic pressing block (or expansion block) 90 is positioned at the center of the upper surface of lower plate 82 and attached thereto. Pressing blocks 88 and 90 each include raised portions 88a and 90a respectively extending therefrom and facing each other. Raised portion 88a has a flat surface of a selected geometric pattern, circular, square, rectangular or various other polygons, for example, which is axially and rotationally aligned with a like flat surface of identical geometric pattern on raised portion 90a. The flat surfaces of raised portions 88a and 90a are parallel to each other. Raised portions 88a and 90a are held in alignment by a guide member 92 positioned in abutment with pressing blocks 88 and 90. Guide member 92 is conveniently of cylindrical shape having an inner diameter sufficiently large to accommodate the maximum lateral extent of pressing blocks 88 and 90 therein.

Metallic bolts 84 and 86 are comprised of a metal having a predetermined thermal coefficient of expansion. Upper plate 80 and lower plate 82 are comprised of a metal having a thermal coefficient of expansion larger than that of metallic bolts 84 and 86. For example, metallic bolts 84 and 86 are typically comprised of a steel other than stainless steel, while upper plate 80 and lower plate 82 are typically comprised of stainless steel. Metallic pressing blocks 88 and 90 are comprised of a metal having a thermal coefficient of expansion greater than that of metallic bolts 84 and 86. For example, pressing blocks 88 and 90 may be comprised of such metals as stainless steel, Dural and other aluminum alloys. Guide member 92 is comprised of a material having a thermal coefficient of expansion equal to or greater than that of pressing blocks 88 and 90.

To achieve the respective thermo-compression diffusion bonds between strain buffers 50 and 60 and wafer 70, surfaces 70a and 70b are smoothened to remove surface damage therefrom. Such surface damage would otherwise cause nonuniform distribution of pressures within wafer 70 and thus wafer fracture when wafer 70 is subjected to the high pressures employed in the thermo-compression diffusion bonding process of the invention. Metallic layers 94 and 96 are then applied to surfaces 70a and 70b, respectively. Each of metallic layers 94 and 96 are comprised of one of such metals as titanium, chromium and nickel. Metallizations 98 and 100 are respectively applied over metallic layers 94 and 96 and are comprised of such metals as copper, silver and gold. Beveled surface 70c is then cleaned to remove contaminants therefrom. A chemical etch may be used to perform this cleaning since at this juncture the structured copper strain buffers are not yet bonded to wafer 70 and thus there is no opportunity for the etch to chemically attack the structured copper strain buffers. Alternately, sputter etching may be used to clean beveled surface 70a. After being cleaned, beveled surface 70c is coated with a passivation material 102 such as polyimide, siloxane, for example. Passivation material 102 may partially extend on to major surfaces 70a and 70b without causing the undesirable generation of bowing forces in wafer 10 during subsequent thermo-compression diffusion bonding, The wafer-metallic-layer-metallization-passivation assembly thus formed is sandwiched between structured copper strain buffers 50 and 60. Structured copper strain buffer 50 is comprised of a bundle of substantially parallel, closely packed strands of copper 52 of substantially equal length with one common end thereof being thermo-compression diffusion bonded to a metallic sheet 54. The opposite common end of copper strands 52 is positioned in abutment with metallization 98. Structured copper strain buffer 60 is essentially identical to structured copper buffer 50 and is comprised of copper strands 62 and metallic sheet 64. The common end of copper strands 62 opposite metallic sheet 64 is positioned in abutment with metallization 100. Strain buffers 50 and 60 each have a lateral extent equal to or less than the lateral extent of the respective wafer 70 surface in contact therewith such that beveled surface 70c remains uncovered by either of the strain buffers.

Additionally, the lateral extent of strain buffers 50 and 60 is sufficiently small such that buffers 50 and 60 do not overlap any passivation material 102 which may be present on wafer surfaces 70a and 70b, respectively. If such overlap were to occur, undesirable bowing forces would likely result. Structured copper strain buffers 50 and 60 are conveniently preformed using the press apparatus and method set forth in my aforementioned patent application Ser. No. 927,344, filed July 24, 1978, the disclosure thereof being incorporated herein by reference.

A layer 104 of nonreactive, compactible material is situated in abutment with metallic sheet 54 of structured copper strain buffer 50. Layer 104 may be comprised of glass wool or Glass Fiber Filter paper available from Fisher Scientific Company, Clifton, New Jersey, or other similarly compactible materials. A layer of compactible material 106 comprised of the same material as layer 104 is positioned in abutment with metallic sheet 64 of structured copper strain buffer 60.

The assembly formed by semiconductor device wafer 70, structured copper strain buffers 50 and 60, and metallic layers 94 and 96 and metallizations 98 and 100 disposed therebetween, together with compactible layers 104 and 106, is positioned in press 50 between raised portions 88a and 90a as shown in FIG. 2. A conventional press (not shown) is used to squeeze upper plate 80 and lower plate 82 together and while such pressure is applied to those plates, bolts 84 and 86 are tightened.

The thermo-compression diffusion bonds between structured copper strain buffer 50 and wafer 70, and between structured copper strain buffer 60 and wafer 70 are actually formed when press 40 containing the above-described assembly, shown in FIG. 2, is surrounded by an inert atmosphere and heated at a temperature within the range of 300° C. to 400° C., typically 325° C., for approximately 15 minutes to 5 hours. When press 40 is heated in this manner, upper plate 80, lower plate 82 and metallic pressing blocks 88 and 90 expand to a greater total extent than do metallic bolts 84 and 86. Therefore, a force is exerted between raised portions 88a and 90a, resulting in the squeezing of structured copper strain buffers 50 and 60 and semiconductor device wafer 70 together and the thermo-compression diffusion bonding of buffers 50 and 60 to wafer 70. The respective thermo-compression diffusion bonds are formed between the portions of wafer 70 and buffers 50 and 60, which experience compressive stress. Guide members 92 expand with temperature to an equal or greater total extent than do metallic pressing blocks 88 and 90 such that guide 92 does not become thermo-compression diffusion bonded thereto.

Although reference is made herein to the thermo-compression diffusion bonding of strain buffers 50 and 60 to wafer 70 for simplicity of description, those skilled in the art will appreciate that the actual thermo-compression diffusion bonds are formed at the interface between the common end of copper strands 52 and metallization 98, and at the interface between the common end of copper strands 62 and metallization 100.

During thermo-compression diffusion bonding, substrateless semiconductor device wafer 70 is subjected to high pressures, specifically, 20,000 psi to 50,000 psi. If this force were not purely compressive, that is, if the semiconductor device wafer 70 is subjected to bowing forces, especially in the region of beveled surface 70c, wafer 70 would likely fracture, resulting in a damaged, unusable semiconductor device. It is thus extremely important that uniform, high pressure be applied over wafer 70.

Prior bonding methods utilized a support plate attached to the semiconductor device wafer to enable the wafer to withstand some degree of bowing forces and nonuniform pressure without fracturing. No such support plate structure is necessary in the present invention, however, since essentially equal pressures are applied to essentially identical selected regions of wafer surfaces 70a and 70b, respectively, which are precisely aligned both axially and rotationally. Such pressures are applied via raised portions 88a and 90a through the intermediate layers of compactible material 104 and 106, strain buffers 50 and 60, metallizations 98 and 100, and metallic layers 94 and 96. Because wafer 70 thus experiences purely compressive pressures, it is not subjected to bowing forces and fracturing that may result therefrom.

Layers of compactible material 104 and 106 are positioned as described above to assure that during thermo-compression diffusion bonding, structured copper strain buffers 50 and 60 do not undesirably diffusion bond to raised surfaces 88a and 90a, respectively. Use of such layers of compactible material facilitates the creation of uniform, substantially void-free diffusion bonds which can otherwise occur when the bonding together of irregular surfaces is attempted. When compressed under high pressure, the layers of compatible material fill in the irregularities in the surfaces allowing raised surfaces 88a and 90a to apply a more evenly distributed pressure to strain buffers 50 and 60 and hence to each of the individual members which are to be bonded together. Use of layers of compactible material 104 and 106 is preferable but not essential to practice of the invention.

Upon completion of the bonding operation, bolts 84 and 86 are loosened to permit removal of the bonded strain buffer-wafer assembly from press 40.

In accordance with another embodiment of the invention, as illustrated in FIG. 3, an "oversized" structured copper strain buffer 160, that is, a strain buffer having a lateral extent equal to or greater than the larger major surface of substrateless wafer 70 having a beveled edge surface 70c, is thermo-compression diffusion bonded to surface 70b of wafer 70, and a structured copper strain buffer 50 having a lateral extent sufficiently small so as not to overlap beveled surface 70c of wafer 70 is thermo-compression diffusion bonded to surface 70a of substrateless wafer 70. The diffusion bonds are formed without subjecting semiconductor device wafer 70 to bowing forces which would likely cause it to fracture. FIG. 3 shows press 40 with materials situated therein for bonding. Press 40 of FIG. 3 is similar to that of FIG. 2, with like numerals indicating like elements. The method for creating such thermo-compression diffusion bonds between wafer 70 and each of strain buffer 50 and "oversized" strain buffer 160 is identical to that described in conjunction with FIG. 2, except for the following differences.

"Oversized" strain buffer 160 is employed instead of strain buffer 60 shown in FIG. 2. Additionally, beveled surface 70c is cleaned and passivated only after the desired thermo-compression diffusion bonds have been formed, preventing passivation material intended for beveled surface 70c from coating portions of major surfaces 70a and 70b near beveled surface 70c before bonding and thereby creating an irregularity in these major surfaces which might result in generation of some unacceptable bowing force during thermo-compression diffusion bonding and consequential wafer fracture.

After the bonding operation, beveled surface 70c is cleaned by such techniques as sputter etching, for example, which is preferable to conventional hot chemical etch cleaning because such an etch likely would chemically attack the structured copper strain buffers bonded to semiconductor device wafer 70. Subsequent to cleaning, beveled surface 70c is coated with a passivation material 202 such as polyimide siloxane, for example.

In actual practice of the invention, heat sinks (not shown) are respectively attached to metallic sheets 54 and 64 of strain buffers 50 and 60. This is accomplished by thermo-compression diffusion bonding during the course of the bonding of strain buffers 50 and 60 to wafer 70, or at a later time as is convenient. Alternatively, heat sink attachment may be accomplished by other suitable means of joining metals together, such as soldering, for example. Thermo-compression diffusion bonding, however, is preferred because it inherently results in superior thermal conductivity between the metallic members which it joins together, allowing more efficient removal of heat from the semiconductor device wafer. Further, practice of the invention is not limited to circular geometries for the various wafers, strain buffers and other layers being bonded into semiconductor device assemblies. Rather, other geometries, such as squares, rectangles polygons and the like may be used in a manner consistent with the practice of the invention.

The foregoing describes a press apparatus and methods for thermo-compression diffusion bonding separate structured copper strain buffers respectively to each of the opposed major surfaces of a substrateless semiconductor device wafer without subjecting the wafer to bowing forces which would tend to cause wafer fracture.

While only certain preferred features of the invention have been shown by way of illustration, many modifications and changes will occur to those skilled in the art. It is, therefore, to be understood that the present claims are intended to cover all such modifications and changes as fall within the true spirit of the invention.

What is claimed is:

1. A method for thermo-compression diffusion bonding first and second structured copper strain buffers to a substrateless semiconductor device wafer including first and second major opposed surfaces of unequal lateral extents and a beveled outer edge surface, said first and second structured copper strain buffers each including a bundle of substantially parallel closely packed strands of copper of substantially equal length having one common end thereof thermo-compression diffusion bonded to a metallic sheet, respectively, said method comprising:

applying first and second metallic layers on said first and second major opposed surfaces, respectively;

applying first and second metallizations on said first and second metallic layers, respectively;

coating said beveled surface with a passivation material;

sandwiching said semiconductor device wafer between and in axial alignment with said first and second structured copper strain buffers, each of said structured copper strain buffers having a lateral extent equal to or less than the lateral extent of the respective major surface of said semiconductor device wafer in contact therewith such that said beveled edge remains uncovered by either of said structured copper strain buffers, the common end of the copper strands of each of said first and second structured copper strain buffers opposite the respective metallic sheet thereof being positioned facing said semiconductor device wafers;

surrounding with an inert atmosphere said semiconductor device wafer and structured copper strain buffers when sandwiched together;

applying a loading force to selected portions of said first and second structured copper strain buffers to squeeze said first and second structured copper strain buffers and said semiconductor device wafer together at high pressure, the selected portion of said first structured copper strain buffer being substantially of identical geometrical size and shape as, and substantially rotationally and axially aligned with, the selected portion of said second structured copper strain buffer; and heating said semiconductor device wafer and structured copper strain buffers at a temperature within the range of 300° C. to 400° C. while said loading force is being applied.

2. The method of claim 1 wherein said first and second metallic layers are comprised of one of the group consisting of titanium, chromium and nickel and said first and second metallizations are comprised of one of the group consisting of copper, silver and gold.

3. The method of claim 1 wherein said high pressure is within the range of approximately 20,000 to 50,000 psi.

4. The method of claim 1 including the step of smoothing said first and second major opposed surfaces prior to applying said first and second metallic layers thereon, respectively.

5. The method of claims 1, 2 or 4 including the step of situating first and second layers of nonreactive compactible material in contact with the metallic sheets of said first and second structured copper strain buffers, respectively, prior to surrounding said semiconductor device wafer and structured copper strain buffers with an inert atmosphere.

6. A method for thermo-compression diffusion bonding first and second structured copper strain buffers to a substrateless semiconductor device wafer having first and second major opposed surfaces and a beveled outer edge surface, said first major surface being smaller than said second major surface, said first and second structured copper strain buffers each including a bundle of substantially parallel closely packed strands of copper of substantially equal length having one common end thereof thermo-compression diffusion bonded to a metallic sheet, respectively, said method comprising:

applying first and second metallic layers on said first and second major opposed surfaces, respectively;

applying first and second metallizations on said first and second metallic layers, respectively;

sandwiching said semiconductor device wafer between and in axial alignment with said first and second structured copper strain buffers, said first structured copper strain buffer being situtated on said first surface and having a lateral extent no greater than the lateral extent of said first major surface, said second structured copper strain buffer having a lateral extent at least equal to the lateral extent of said second surface, the common ends of the copper strands of said structured copper strain buffers opposite the respective metallic sheets thereof being positioned so as to face and abut said semiconductor device wafer;

surrounding with an inert atmosphere said semiconductor device wafer and structured copper strain buffers when sandwiched together;

applying a loading force to selected portions of said first and second structured copper strain buffers to squeeze said first and second structured copper strain buffers and said semiconductor device wafer together at high pressure, the selected portion of said first structured copper strain buffer being substantially of identical geometrical size and shape as, and substantially rotationally and axially aligned with, the selected portion of said second structured copper strain buffer;

heating said semiconductor device wafer and structured copper strain buffers at a temperature within the range of 300° C. to 400° C. while said loading force is being applied; and finally coating said beveled surface with a passivation material.

7. The method of claim 6 wherein said first and second metallic layers are comprised of one of the group consisting of titanium, chromium and nickel and said first and second metallizations are comprised of one of the group consisting of copper, silver and gold.

8. The method of claim 6 wherein first and second layers of nonreactive compactible material are situated in contact with the metallic sheets of said first and second structured copper strain buffers, respectively, prior to surrounding said semiconductor device wafer and structured copper strain buffers with an inert atmosphere.

9. The method of claim 8 wherein said first and second metallic layers are comprised of one of the group consisting of titanium, chromium and nickel and said first and second metallizations are comprised of one of the group consisting of copper, silver and gold.

10. The method of claims 6, 7, 8 or 9 wherein said high pressure is within the range of approximately 20,000 to 50,000 psi.

11. The method of claims 6, 7 or 8 including the step of smoothing said first and second major opposed surfaces prior to applying said first and second metallic layers thereon, respectively.

12. The method of claim 11 wherein said high pressure is within the range of approximately 20,000 to 50,000 psi.

* * * * *